United States Patent
Koizumi et al.

(10) Patent No.: US 11,086,744 B2
(45) Date of Patent: Aug. 10, 2021

(54) MEMORY SYSTEM

(71) Applicant: Toshiba Memory Corporation, Minato-ku (JP)

(72) Inventors: Shinya Koizumi, Kamakura (JP); Kouji Watanabe, Tokyo (JP)

(73) Assignee: Toshiba Memory Corporation, Minato-ku (JP)

( * ) Notice: Subject to any disclaimer, the term of this patent is extended or adjusted under 35 U.S.C. 154(b) by 71 days.

(21) Appl. No.: 16/561,841

(22) Filed: Sep. 5, 2019

(65) Prior Publication Data

US 2020/0233769 A1 Jul. 23, 2020

(30) Foreign Application Priority Data

Jan. 21, 2019 (JP) .............................. JP2019-007678

(51) Int. Cl.
*G06F 11/30* (2006.01)
*G06F 13/16* (2006.01)
*G11C 5/14* (2006.01)
*G11C 11/4074* (2006.01)

(52) U.S. Cl.
CPC ...... *G06F 11/3037* (2013.01); *G06F 11/3058* (2013.01); *G06F 13/1668* (2013.01); *G11C 5/147* (2013.01); *G11C 11/4074* (2013.01)

(58) Field of Classification Search
CPC ............. G06F 13/1668; G06F 11/3037; G06F 11/3058; G11C 5/147; G11C 11/4074
USPC ........................................................ 711/154
See application file for complete search history.

(56) References Cited

U.S. PATENT DOCUMENTS

| 9,348,380 | B2 | 5/2016 | Ping et al. | |
|---|---|---|---|---|
| 9,575,677 | B2 | 2/2017 | Ellis et al. | |
| 2014/0068287 | A1* | 3/2014 | Teoh .................... | G06F 1/3287 |
| | | | | 713/310 |
| 2019/0065086 | A1* | 2/2019 | Margetts ............... | G06F 3/0659 |
| 2019/0138225 | A1* | 5/2019 | Lee ....................... | G06F 3/0679 |
| 2020/0026346 | A1 | 1/2020 | Nosaka et al. | |

FOREIGN PATENT DOCUMENTS

| JP | 2015-127955 A | 7/2015 |
|---|---|---|
| JP | 2016-212580 A | 12/2016 |
| JP | 2020-13626 A | 1/2020 |

\* cited by examiner

*Primary Examiner* — Hua J Song
(74) *Attorney, Agent, or Firm* — Oblon, McClelland, Maier & Neustadt, L.L.P.

(57) ABSTRACT

A memory system includes a first memory chip, and a controller that includes a first circuit, a second circuit, and a third circuit. The third circuit is configured to manage a first differential power consumption value that is a difference between first and second power consumption values. The first power consumption value is on first power that the first memory chip consumes while executing a first operation. The second power consumption value is on second power that the first memory chip consumes when suspending the first operation. The third circuit is configured to determine whether causing the first memory chip to suspend the first operation to execute a second operation is possible based on the first differential power consumption value.

19 Claims, 9 Drawing Sheets

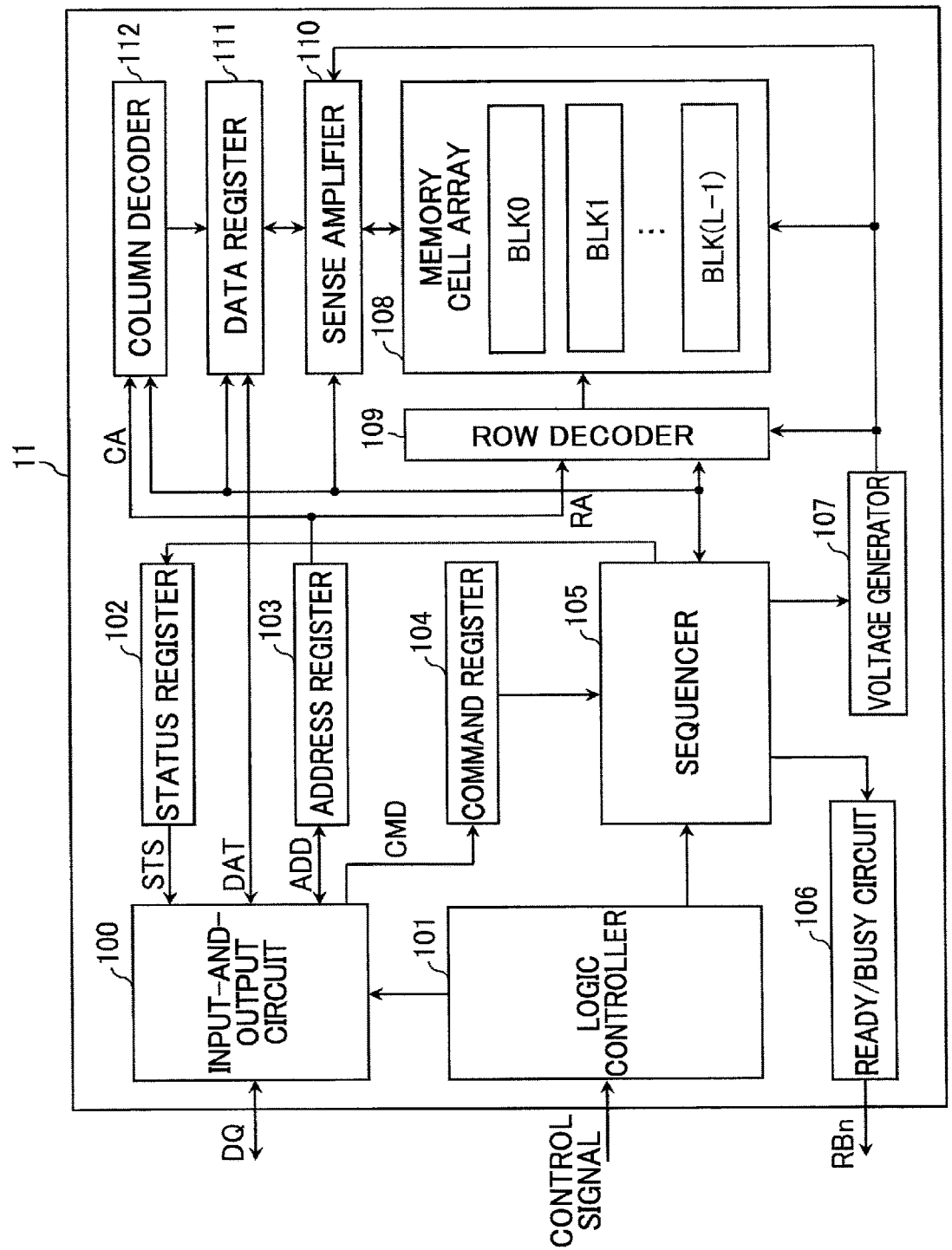
F I G. 2

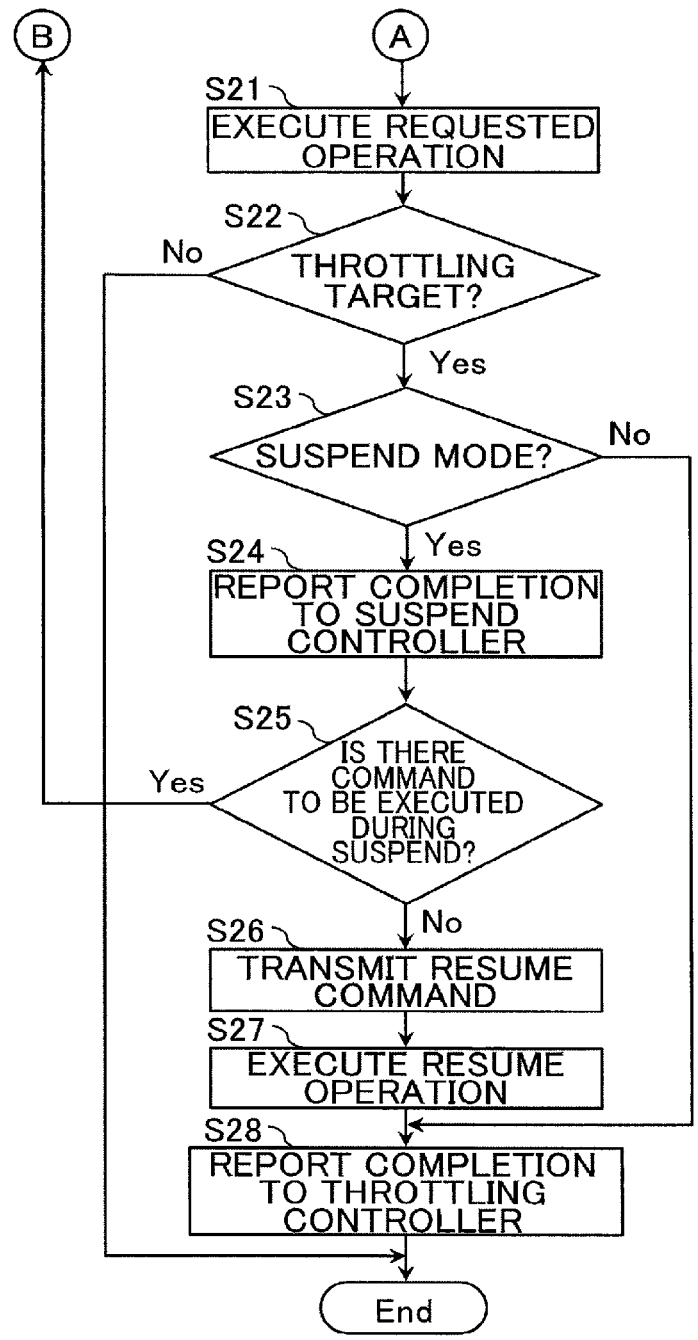
F I G. 7

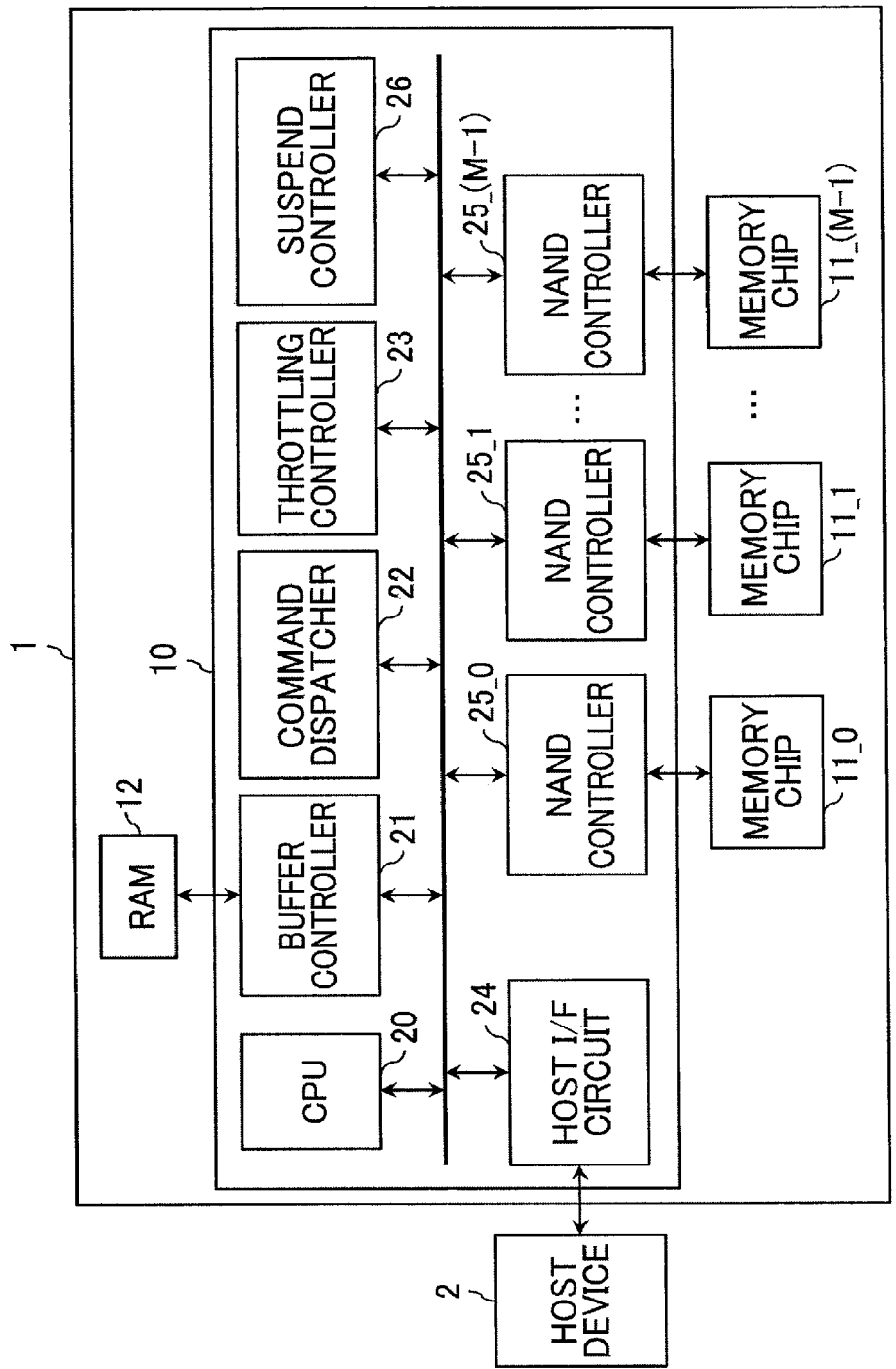
F I G. 9

MEMORY SYSTEM

CROSS-REFERENCE TO RELATED APPLICATIONS

This application is based upon and claims the benefit of priority from Japanese Patent Application No. 2019-007678, filed Jan. 21, 2019, the entire contents of which are incorporated herein by reference.

FIELD

Embodiments described herein generally relate to a memory system.

BACKGROUND

As a memory system, a solid state drive (SSD) which includes a non-volatile semiconductor memory such as a NAND-type flash memory is known.

BRIEF DESCRIPTION OF THE DRAWINGS

FIG. 2 is a block diagram of a memory chip included in the memory system according to the first embodiment;

FIG. 7 is a flowchart illustrating the flow of the overall operation in the memory system according to the first embodiment;

FIG. 9 is a block diagram of a memory system according to a modification.

DETAILED DESCRIPTION

In general, according to one embodiment, a memory system includes: a first memory chip; and a controller to which the first memory chips is coupled. The controller includes: a first circuit, a second circuit and a third circuit. The first circuit is configured to issue a command. The second circuit is configured to control the first memory chip based on a command received from the first circuit. The third circuit is configured to manage a first differential power consumption value that is a difference between a first power consumption value and a second power consumption value. The first power consumption value is on first power that the first memory chip consumes while executing a first operation. The second power consumption value is on second power that the first memory chip consumes when suspending the first operation. The third circuit is configured to determine whether causing the first memory chip to suspend the first operation to execute a second operation is possible based on the first differential power consumption value.

1 First Embodiment

Hereinafter, a memory system according to a first embodiment will be described. In the following descriptions, a case where the memory system is a solid state drive (SSD) will be described by way of example.

1.1 Configuration

1.1.1 Overall Configuration of Memory System

First, an overall configuration of a memory system 1 will be described using FIG. 1.

Figure 1:
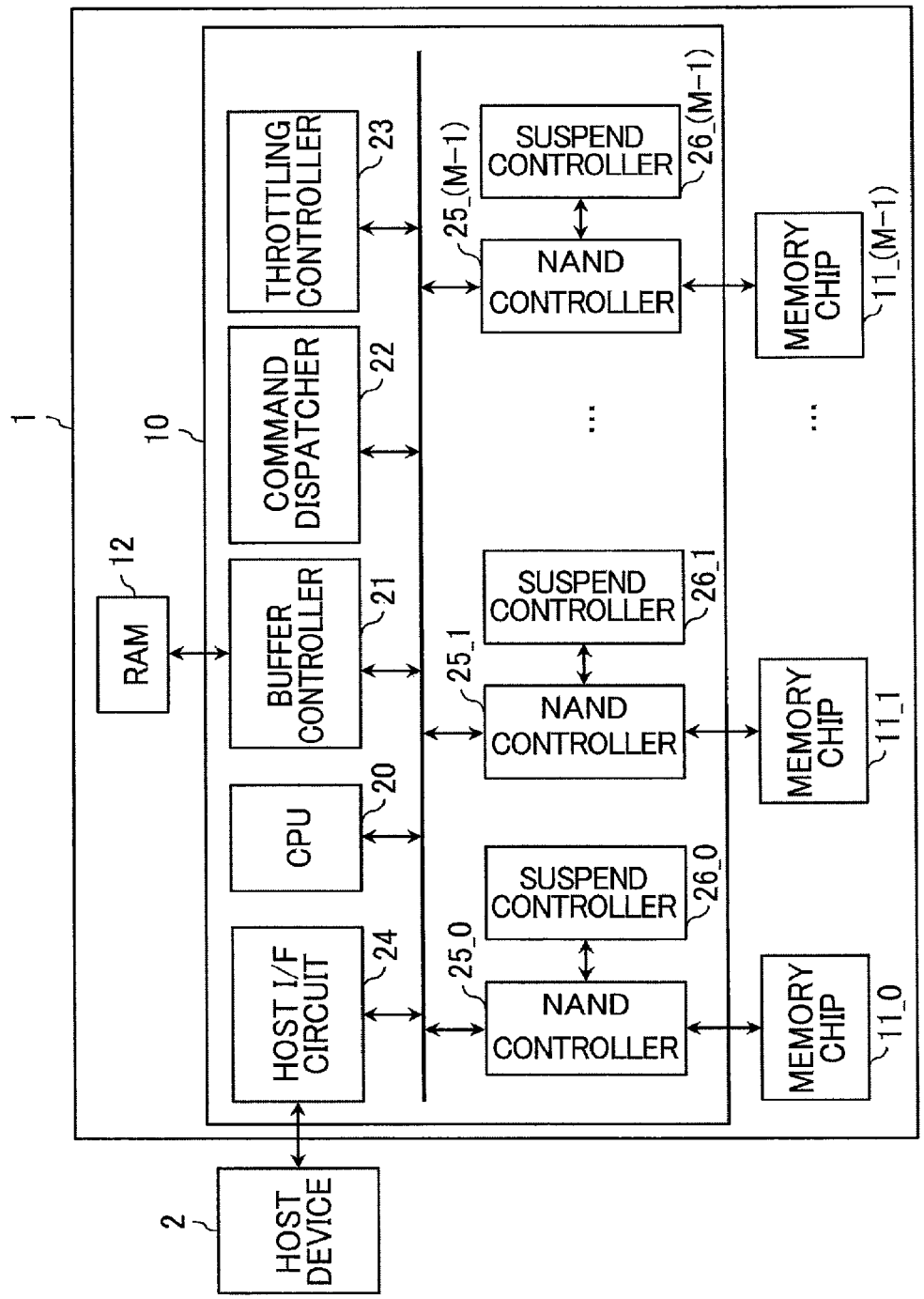
FIG. 1 is a block diagram of a memory system according to a first embodiment.

As illustrated in FIG. 1, the memory system 1 includes a memory controller 10, M (M is an integer of 2 or more) non-volatile memory chips 11_0 to 11_(M-1), and a random access memory (RAM) 12. Hereinafter, each of the memory chips 11_0 to 11_(M-1) will be referred to as the memory chip 11, unless specified.

The memory controller 10 manages a memory space of the memory chip 11. The memory controller 10 also instructs the memory chip 11 to execute read, write, and erase operations of data, in response to a request from a host device 2. The memory controller 10 may be, for example, a system on a chip (SoC). Note that each function of the memory controller 10 may be realized by a dedicated circuit, or may be realized by a processor executing firmware. In the present embodiment, a case where a dedicated circuit to realize each function is provided in the memory controller 10 will be described.

In the memory system 1, an upper limit value of power consumption is set as a device specification. In order to strictly keep the upper limit value of power consumption, power throttling control is performed in the memory controller 10. More specifically, for example, in the memory controller 10, an upper limit value of a power consumption value is set in advance to control power consumption of the entirety of the memory system 1. Then, among commands transmitted from the memory controller 10 to the memory chips 11, a command, such as one for a write operation, an erase operation or a read operation is defined as a throttling target command, and a power consumption value corresponding to power consumption of each command is assigned to each command. For example, if power consumption is larger in the order of the read operation, write operation and erase operation, the power consumption value is set to values larger in the order of the read operation, write operation and erase operation. If a sum of power consumption values of a plurality of commands to be executed does not exceed the upper limit value of the power consumption value, the memory controller 10 can execute these commands at the same time. The memory controller 10 controls power consumption by controlling the sum of power consumption values of commands, which are being executed, so as not to exceed the upper limit value of the power consumption value of the entire memory system 1.

In addition, when the memory system 1 suspends an operation corresponding to a command to which a power consumption value is assigned, there occurs a consumption amount of power corresponding to a difference between an operating state and a suspend state (hereinafter referred to as "differential power consumption value"). The memory system 1 can lend the differential power consumption value as a lendable power consumption amount to some other command having a power consumption value that is smaller than the lendable power consumption amount, and can execute this other command.

The memory controller 10 includes a processor (CPU: central processing unit) 20, a buffer controller 21, a command dispatcher 22, a throttling controller 23, a host interface circuit 24, and M NAND controllers 25_0 to 25_(M-1), and M suspend controllers 26_0 to 26_(M-1) corresponding to the M NAND controllers 25_0 to 25_(M-1), respectively. Hereinafter, each of the NAND controllers 25_0 to 25_(M-1) will be referred to as the NAND controller 25, unless specified. Each of the suspend controllers 26_0 to 26_(M-1) will be referred to as the suspend controller 26, unless specified.

The processor 20 controls the overall operation of the memory controller 10. In addition, the processor 20 executes various types of processing for managing the memory chip 11, such as garbage collection and wear leveling. The garbage collection is an operation of moving valid data, which exists in an erase target memory area during execution of an erase operation, into another memory area. Furthermore, the processor 20 executes various kinds of arithmetic operations. For example, the processor 20 executes encryption processing and randomization processing of data.

The buffer controller 21 controls transmission and reception of data between the memory controller 10 and the RAM 12.

When receiving an operation request for a write operation, a read operation, an erase operation, or the like, from the host device 2 or the processor 20, the command dispatcher 22 generates a command (including an address or data, etc.) corresponding to the operation request. Then, the command dispatcher 22 selects a NAND controller 25 that is to execute the request, and transmits the generated command thereto. For example, when a write operation or an erase operation, which is being executed, is to be suspended and an operation request (for example, for a read operation) having a relatively high priority, which is based on determination of the processor 20 or instruction by the host device 2, is to be executed, the command dispatcher 22 generates a command corresponding to the operation request as a priority command. For example, the priority command may be a suspend command or a command to which some other prefix command is added.

The throttling controller 23 manages power consumption values of a plurality of commands which are being executed in the entire memory system 1, and performs throttling control. For example, when receiving, from the NAND controller 25, an inquiry of whether a throttling management target command is executable, the throttling controller 23 determines whether the command is executable on the basis of a power consumption value of the inquired command and a power consumable amount (for example, a value obtained by subtracting a sum of power consumption values of commands currently being executed from the upper limit value of the power consumption value). The throttling controller 23 then transmits the result of the determination to the NAND controller 25. In addition, when receiving a report of command completion from the NAND controller 25, the throttling controller 23 adds a power consumption value of the completed command to the power consumable amount.

In addition, when access is to be concentrated on a particular memory chip 11 for the purpose of garbage collection, wear leveling or the like and the throttling controller 23 receives such instructions from the processor 20, the throttling controller 23 preferentially allocates a power consumable amount to the corresponding NAND controller 25 and restricts the allocation of the power consumable amount to the other NAND controllers 25. Specifically, the throttling controller 23 can set, to each of the NAND controllers 25, a ratio of an usable power consumption value (hereinafter referred to as "occupation ratio of the power consumption value") relative to the upper limit value of the power consumption value.

The host interface circuit 24 is coupled to the host device 2 via a controller bus, and manages communications with the host device 2. The host interface circuit 24 transfers a request (including instruction, address, and data) received from the host device 2 to, for example, the processor 20, the buffer controller 21, and the command dispatcher 22. In addition, in response to an instruction of the processor 20, the host interface circuit 24 transmits data, etc. read from the memory chip 11 to the host device 2.

The NAND controller 25 controls the corresponding memory chip 11. In the example of FIG. 1, one NAND controller 25 controls one memory chip 11, but one NAND controller 25 may control a plurality of memory chips 11.

When receiving a command from the command dispatcher 22, the NAND controller 25 determines one command to be executed in the memory chip 11 while adjusting the execution order of a plurality of commands. In addition, if the determined command is a throttling management target, the NAND controller 25 inquires whether the command is executable from the throttling controller 23.

Besides, when the NAND controller 25 receives a priority command while the corresponding memory chip 11 is executing a command, the NAND controller 25 inquires the suspend controller 26 about whether the priority command is executable.

The suspend controller 26 manages a differential power consumption value in the corresponding NAND controller 25. More specifically, for example, even when a write operation that is being executed in the memory chip 11 coupled to the corresponding NAND controller 25 is suspended, the power consumption value allocated to the memory chip 11 is kept until the write operation is completed, and is not allocated to another memory chip 11. Thus, during a period in which an operation is suspended in the memory chip 11 coupled to the corresponding NAND controller 25, the suspend controller 26 manages the power consumption value in this memory chip (that is, executes the power throttling control). Then, when the priority command is executed by the corresponding NAND controller 25 (more specifically, executed in the memory chip 11 coupled to the corresponding NAND controller 25), the suspend controller 26 allocates the differential power consumption value to the priority command.

Thereby, the differential power consumption value is managed with respect to each of the NAND controllers 25 (with respect to each of the memory chips 11 coupled to the corresponding NAND controllers 25).

More specifically, for example, when the suspend controller 26 receives from the corresponding NAND command is executable, the suspend controller 26 compares the differential power consumption value, which has been produced by suspending the command that is being executed, and the power consumption value of the priority command, and determines whether or not the priority command is executable. Then, the suspend controller 26 transmits the determination result to the NAND controller 25. For example, the suspend controller 26 stores the differential power consumption value of the corresponding NAND controller 25. Alternatively, when the priority command is executed during a suspend mode period, the suspend controller 26 stores the power consumption value corresponding to the priority command, on the basis of command information of the priority command. In doing so, the suspend controller 26 may store the power consumption value, for example, with associating the power consumption value with the address of the memory chip 11. In addition, when the suspend controller 26 receives a report of the completion of the priority command from the corresponding NAND controller 25, the suspend controller 26 adds the power consumption value of the completed priority command to the lendable amount of the power consumption value (the value obtained by subtracting the power consumption value of the currently executed command from the differential power consumption value). The management of the differential power consumption value by the suspend controller 26 will be described later.

The memory chip 11 performs a write operation and a read operation of data in a specific write unit made of a plurality of memory cells. Furthermore, the memory chip 11 erases data in an erase unit made of a plurality of write units. For example, when the memory chip 11 is a NAND-type flash memory, the memory chip 11 performs a write operation and a read operation in units of a page. Hereinafter, a case where the memory chip 11 is a three-dimensional stacked NAND-type flash memory with memory cell transistors stacked three-dimensionally above a semiconductor substrate will be described. It should be noted that the memory chip 11 is not limited to a three-dimensional stacked NAND-type flash memory, and may be a flat NAND-type flash memory with memory cell transistors arranged two-dimensionally on a semiconductor substrate, and may be another non-volatile memory. The configuration of the memory chip 11 will be described later in detail.

The RAM 12 is a semiconductor memory such as a dynamic random access memory (DRAM), and is used as a work area of the processor 20. For example, the RAM 12 stores a power consumption value, etc. corresponding to a command. Note that the RAM 12 may be provided in the memory controller 10.

1.1.2 Configuration of Memory Chip

Next, a configuration of the memory chip 11 will be described using FIG. 2. In FIG. 2, some of the connections between the blocks are indicated by arrows; however, the connections between the blocks are not limited to those shown in FIG. 2.

As shown in FIG. 2, the memory chip 11 includes an input-and-output circuit 100, a logic controller 101, a status register 102, an address register 103, a command register 104, a sequencer 105, a ready/busy circuit 106, a voltage generator 107, a memory cell array 108, a row decoder 109, a sense amplifier 110, a data register 111, and a column decoder 112.

The input-and-output circuit 100 controls input-and-output of a signal DQ to and from the NAND controller 25. More specifically, the input-and-output circuit 100 transmits data DAT received from the NAND controller 25 via the signal DQ to the data register 111, transmits an address ADD to the address register 103, and transmits a command CMD to the command register 104. In addition, the input-and-output circuit 100 transmits status information STS received from the status register 102, the data DAT received from the data register 111, and the address ADD received from the address register 103, etc. to the NAND controller 25 via the signal DQ.

The logic controller 101 receives various control signals from the NAND controller 25. Then, the logic controller 101 controls the input-and-output circuit 100 and the sequencer 105 according to the received control signals.

The status register 102, for example, temporarily stores the status information STS in write, read, and erase operations, and informs the NAND controller 25 of whether the operation is normally finished. In addition, the status register 102 temporarily stores program parameter information obtained during a write operation.

The address register 103 temporarily stores the address ADD received from the NAND controller 25 via the input-and-output circuit 100. Then, the address register 103 transfers a row address RA to the row decoder 109, and transfers a column address CA to the column decoder 112.

The command register 104 temporarily stores the command CMD received from the NAND controller 25 via the input-and-output circuit 100, and transfers the command CMD to the sequencer 105.

The sequencer 105 controls an operation of the entire memory chip 11. More specifically, the sequencer 105 controls, for example, the status register 102, the ready/busy circuit 106, the voltage generator 107, the row decoder 109, the sense amplifier 110, the data register 111, and the column decoder 112, etc., according to the command CMD stored in the command register 104, and executes write, read, and erase operations, etc.

The ready/busy circuit 106 transmits a ready/busy signal RBn to the NAND controller 25 according to an operating status of the sequencer 105. More specifically, while the memory chip 11 is in a ready state, the signal RBn is at a high ("H") level, and while the memory chip 11 is in a busy state, the signal RBn is at a low ("L") level.

The voltage generator 107 generates voltages needed for write, read, and erase operations according to the control of the sequencer 105, and supplies the generated voltages to, for example, the memory cell array 108, the row decoder 109, and the sense amplifier 110. The row decoder 109 and the sense amplifier 110 apply the voltages supplied from the voltage generator 107 to memory cell transistors in the memory cell array 108.

The memory cell array 108 includes a plurality of blocks BLK (BLK0, BLK1, . . . , BLK(L-1)) (L is an integer of 2 or more). Each block BLK includes a plurality of non-volatile memory cell transistors (hereinafter, referred to also as "memory cells") associated with rows and columns.

The row decoder 109 decodes the row address RA. The row decoder 109 applies necessary voltages to the memory cell array 108 on the basis of a result of the decoding.

In a read operation, the sense amplifier 110 senses data read from the memory cell array 108. Then, the sense amplifier 110 transmits the read data to the data register 111. In addition, in a write operation, the sense amplifier 110 transmits write data to the memory cell array 108.

The data register 111 includes a plurality of latch circuits. The latch circuit temporarily latches write data or read data.

In write, read, and erase operations, for example, the column decoder 112 decodes the column address CA, and selects latch circuits in the data register 111 according to a result of the decoding.

1.1.3 Configuration of Memory Cell Array

Next, a configuration of the memory cell array 108 will be described using FIG. 3. An example of FIG. 3 illustrates a block BLK0, but other blocks BLK have the same configurations.

Figure 3:
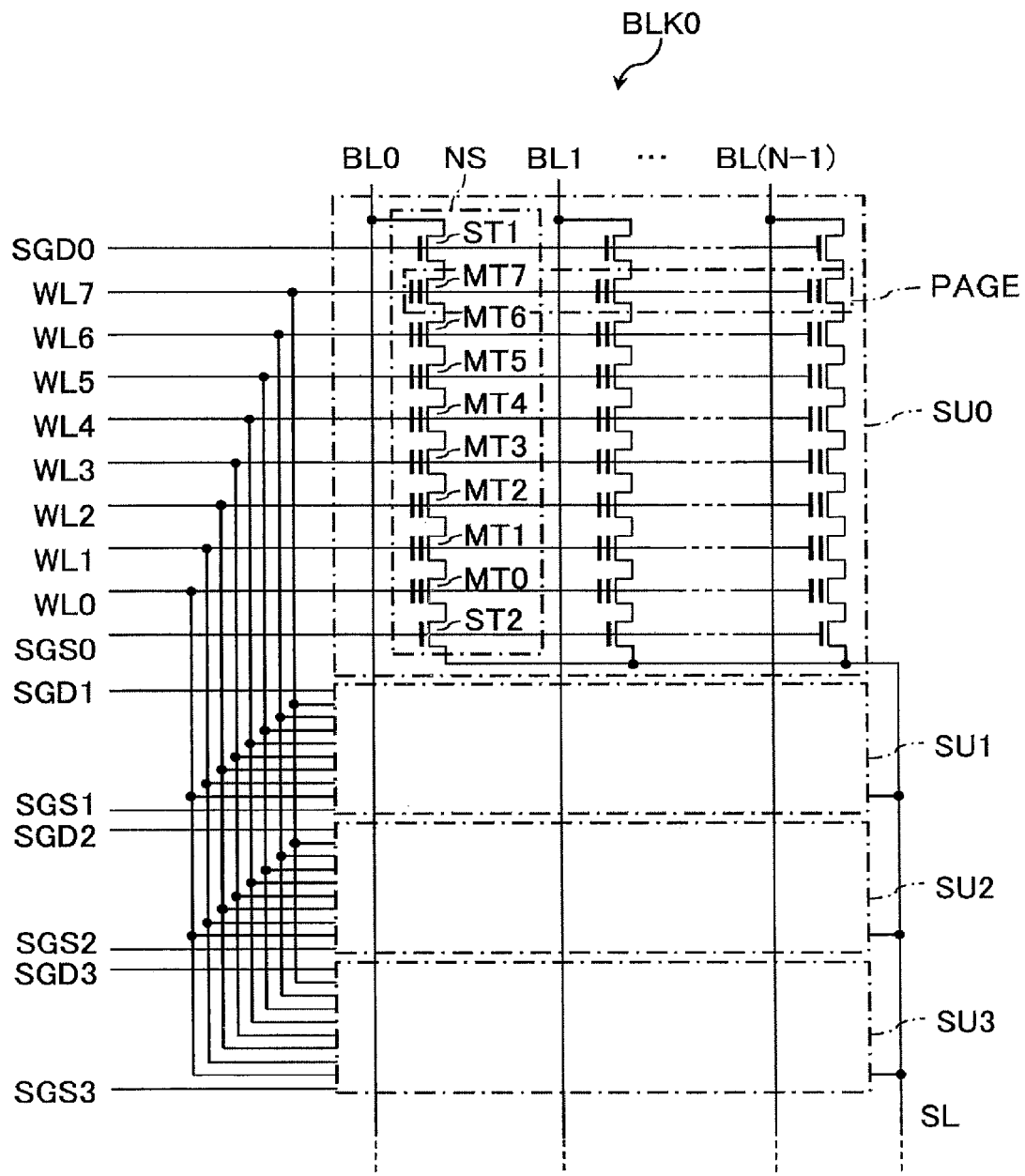
FIG. 3 is a circuit diagram of a memory cell array in the memory chip included in the memory system according to the first embodiment.

As illustrated in FIG. 3, the block BLK0 includes, for example, four string units SU (SU0 to SU3). Each of the string units SU includes a plurality of NAND strings NS. Each of the NAND strings NS includes, for example, eight memory cell transistors MT0 through MT7 and select transistors ST1 and ST2. Hereinafter, each of the memory cell transistors MT0 through MT7 will be referred to as the memory cell transistor MT, unless specified. The memory cell transistor MT includes a control gate and a charge storage layer, and stores data in a nonvolatile manner.

It should be noted that the memory cell transistor MT may be of a MONOS type in which an insulating film is used as the charge storage layer, or an FG type in which a conductive layer is used as the charge storage layer. The number of memory cell transistors MT per NAND string NS is not limited to 8, and may be 16, 32, 64, 96, 128, etc., and the number thereof is not limited to these numbers. Moreover, the number of the select transistors ST1 and ST2 may be discretionally chosen, and may be one or more.

The memory cell transistors MT are coupled in series between the source of the select transistor ST1 and the drain of the select transistor ST2. More specifically, current paths of the memory cell transistors MT0 through MT7 are coupled in series. The drain of the memory cell transistor MT7 is coupled to the source of the select transistor ST1, and the source of the memory cell transistor MT0 is coupled to the drain of the select transistor ST2.

The gates of the select transistors ST1 in the string units SU0 through SU3 are coupled to the row decoder 109 via the respective select gate lines SGD0 through SGD3. Similarly, the gate of the select transistor ST2 in each of the string units SU0 through SU3 is coupled to the row decoder 109 via the respective select gate lines SGS0 through SGS3. Hereinafter, each of the select gate lines SGD0 through SGD3 will be referred to as the select gate line SGD, unless specified. Each of the select gate lines SGS0 through SGS3 will be referred to as the select gate line SGS, unless specified. It should be noted that the select gate lines SGS0 through SGS3 of the respective string units SU may be coupled in common.

The control gates of the memory cell transistors MT0 through MT7 in the block BLK are commonly coupled to word lines WL0 through WL7, respectively. The word lines WL0 through WL7 are coupled to the row decoder 109. Hereinafter, each of the word lines WL0 through WL7 will be referred to as the word line WL, unless specified.

The drains of the select transistors ST1 of the NAND strings NS in the string unit SU are coupled to different bit lines BL0 through BL(N-1) (N is an integer of 2 or more). Hereinafter, each of the bit lines BL0 through BL(N-1) will be referred to as the bit line BL, unless specified. Each bit line BL is coupled to the sense amplifier 110. Each bit line BL couples one NAND string NS in each string unit SU in common among a plurality of blocks BLK. Moreover, the sources of a plurality of select transistors ST2 are coupled in common to a source line SL. Namely, the string unit SU is a group of NAND strings NS coupled to different bit lines BL and the same select gate lines SGD and SGS. In addition, the block BLK is a group of a plurality of string units SU sharing the word lines WL. Thus, the memory cell array 108 is a group of a plurality of blocks BLK sharing the bit lines BL.

Data writing and reading are performed on the memory cell transistors MT coupled to any one of the word lines WL (hereinafter, referred to as a selected word line WL) in any one of the string units SU together. Hereinafter, a group of one-bit data to be written to or read from each of the memory cell transistors MT selected together will be referred to as a "page."

1.2 Example of Power Throttling Control in Throttling Controller

Next, referring to FIG. 4, a description will be given of an example of the power throttling control in the throttling controller 23. Hereinafter, a case in which the upper limit value of the power consumption value is "10" is described. Note that the upper limit value of the power consumption value can be discretionally set.

Figure 4:
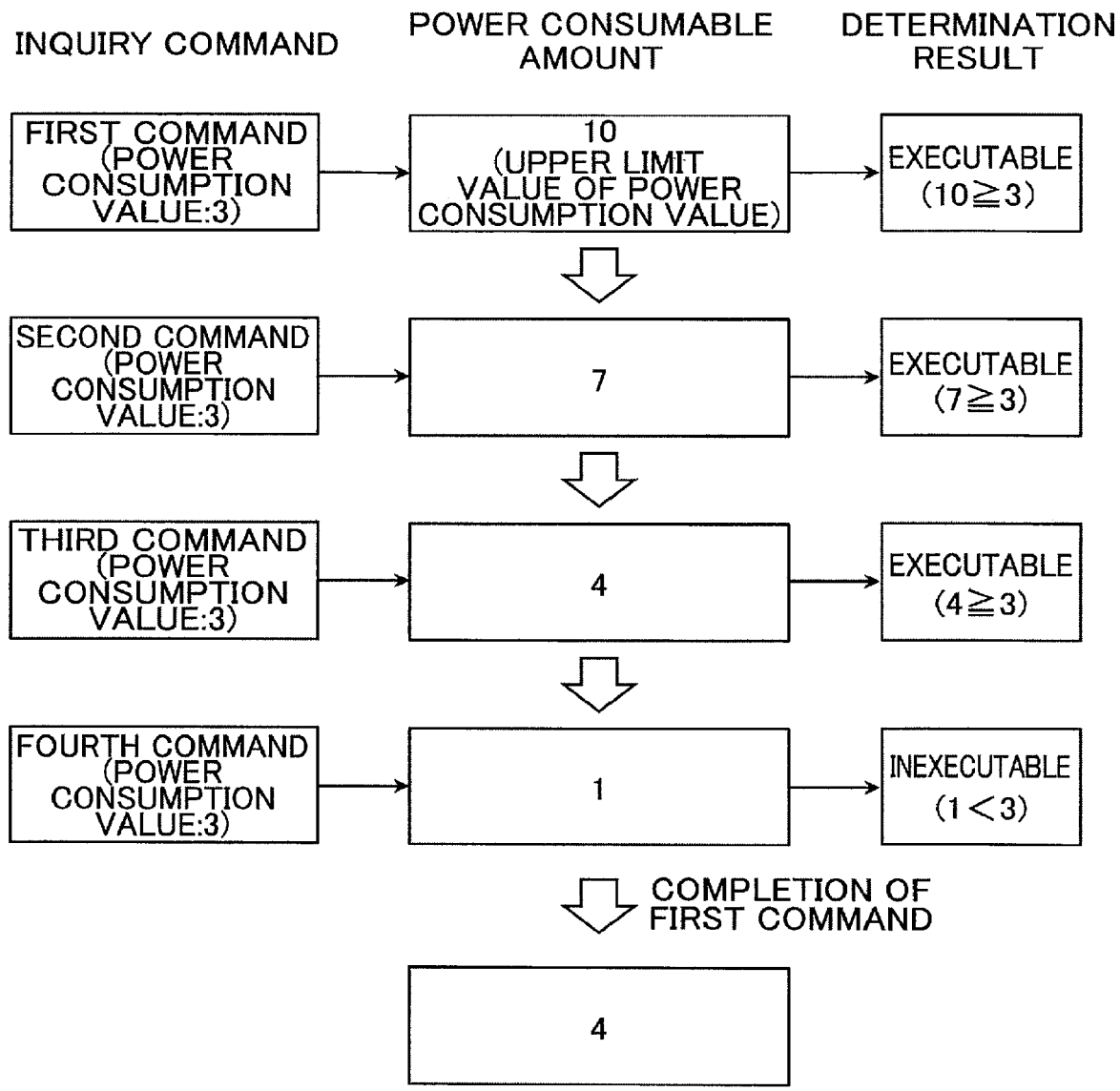
FIG. 4 is a view illustrating an example of power throttling control in a throttling controller in the memory system according to the first embodiment.

As illustrated in FIG. 4, for example, when none of the NAND controllers 25 executes a command that is a throttling control target, the throttling controller 23 stores an upper limit value "10" of the power consumption value as a power consumable amount. In this state, for example, when the throttling controller 23 receives an inquiry about a first command (for example, power consumption value "3"), the throttling controller 23 determines that the first command is executable, since the power consumption value "3" corresponding to the first command of the inquiry is not greater than the power consumable amount "10", and transmits the determination result to the corresponding NAND controller 25. Then, the throttling controller 23 changes the power consumable amount to "7".

Next, when the throttling controller 23 receives an inquiry about a second command (for example, power consumption value "3"), the throttling controller 23 determines that the second command is executable, since the power consumption value "3" corresponding to the second command of the inquiry is not greater than the power consumable amount "7", and transmits the determination result to the corresponding NAND controller 25. Then, the throttling controller 23 changes the power consumable amount to "4".

Subsequently, when the throttling controller 23 receives an inquiry about a third command (for example, power consumption value "3"), the throttling controller 23 determines that the third command is executable, since the power consumption value "3" corresponding to the third command of the inquiry is not greater than the power consumable amount "4", and transmits the determination result to the corresponding NAND controller 25. Then, the throttling controller 23 changes the power consumable amount to "1".

Next, when the throttling controller 23 receives an inquiry about a fourth command (for example, power consumption value "3"), the throttling controller 23 determines that the fourth command is inexecutable, since the power consumption value "3" corresponding to the fourth command of the inquiry is greater than the power consumable amount "1", and transmits the determination result to the corresponding NAND controller 25. Then, the throttling controller 23 keeps the power consumable amount "1".

Thereafter, for example, when the throttling controller 23 receives a report of the completion of the first command from the NAND controller 25, the throttling controller 23 adds the power consumption value "3" corresponding to the first command to the power consumable mount "1", and changes the power consumable mount to "4".

1.3 Example of Power Throttling in Suspend Controller

Next, an example of the power throttling control in the suspend controller 26 will be described.

1.3.1 Operation Modes of Write Operation and Erase Operation

To begin with, operation modes of the write operation and erase operation are explained in brief.

Each of the write operation and erase operation includes three operation modes, namely a normal mode, a suspend mode and a resume mode. The normal mode is a mode which is selected when the write operation or erase operation is started. The suspend mode is a mode which is selected when the write operation or erase operation, which is being executed, is suspended. The resume mode is a mode which is selected when the write operation or erase operation that has been suspended is resumed.

In the present embodiment, the power consumption value in the write operation and erase operation varies example, the power consumption value in the normal mode and the power consumption value in the resume mode are set to be equal. In addition, the power consumption value in the suspend mode is set to a power consumption value, for example, "0", which is smaller than the power consumption value in the normal mode and the power consumption value in the resume mode. Hereinafter, in the write operation, it is assumed that the power consumption values of the normal mode and resume mode are "3", and the power consumption value of the suspend mode is "0".

1.3.2 Example in which Another Command is Executed During Suspend Mode Period Next, referring to FIG. 5, a description will be given of an example of the case in which another command is executed during the suspend mode period (that is, the period from the transition to the suspend mode to the transition to the resume mode).

Figure 5:
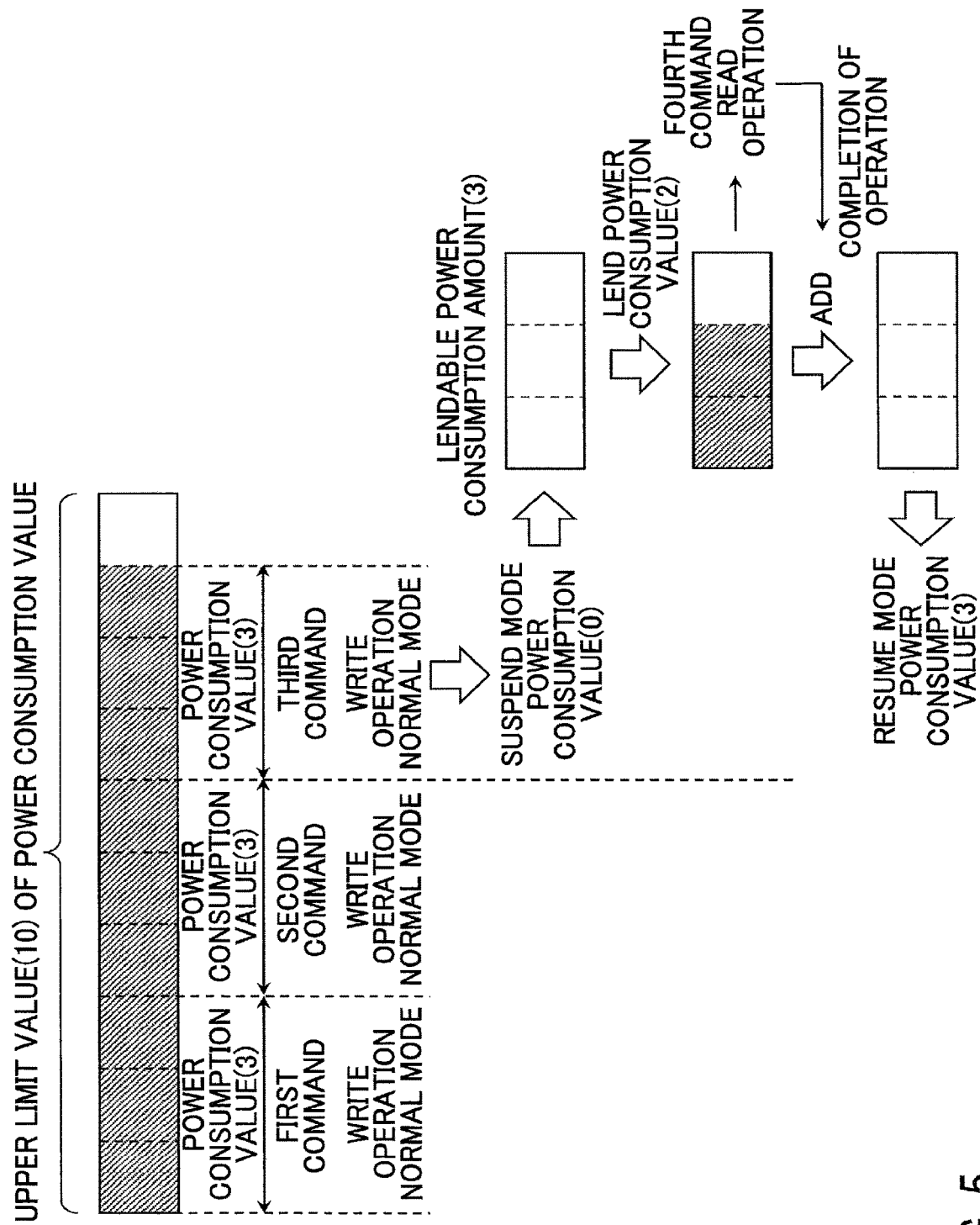
FIG. 5 is a view illustrating an example in which another command is executed during a suspend mode period in the memory system according to the first embodiment.

As illustrated in FIG. 5, for example, in the throttling control by the throttling controller 23, the NAND controller 25_0 is executing a first command, the NAND controller 25_1 is executing a second command, and the NAND controller 25_2 is executing a third command. For example, when each of the first to third commands corresponds to the write operation of the normal mode, the sum of the power consumption values of the three commands is "9" and is smaller than the upper limit value "10" of the power consumption value.

In this state, for example, when the NAND controller 25_2, which has been executing the third command, transitions in its write operation from the normal mode to the suspend mode, the suspend controller 26_2 corresponding to the NAND controller 25_2 manages, as a lendable power consumption amount, the differential power consumption value "3" that is a difference between the power consumption value "3" of the normal mode and the power consumption value "0" of the suspend mode.

Then, in response to an inquiry from the NAND controller 25_2, the suspend controller 26_2 allocates a lendable power consumption amount "2" to, for example, a fourth command (for example, a read operation of a power consumption value "2"), and changes the lendable power consumption amount to "1". As a result, in the memory chip 11 in which the third command has been suspended, the read operation corresponding to the fourth command is executed. Specifically, the memory system 1 can simultaneously execute these four commands.

For example, when the suspend controller 26_2 receives a report of the completion of the fourth command from the corresponding NAND controller 25_2, the suspend controller 26_2 adds the power consumption value "2" corresponding to the fourth command to the remaining lendable power consumption amount "1", and changes the lendable power consumption amount to "3".

When there is no other priority command to be executed, the lendable power consumption amount "3" is returned to the NAND controller 25_2 by the suspend controller 26_2. Then, the NAND controller 25_2 transitions in its write operation corresponding to the third command from the suspend mode to the resume mode, and resumes the write operation.

Note that during the suspend mode period, the suspend controller 26 can allocate the differential power consumption value to an execution of the next command, each time the command, which has been executed with the allocation of the differential power consumption, is completed. Thus, although the number of operations which can be simultaneously executed is four, as long as the power consumption value of a priority command that is to be executed during the suspend mode period is smaller than the differential power consumption value, such a priority command can be preferentially executed any times.

1.4 Flow of Overall Operation in Memory System

Next, referring to FIG. 6 and FIG. 7, a flow of an overall operation in the memory system 1 will be described.

Figure 6:
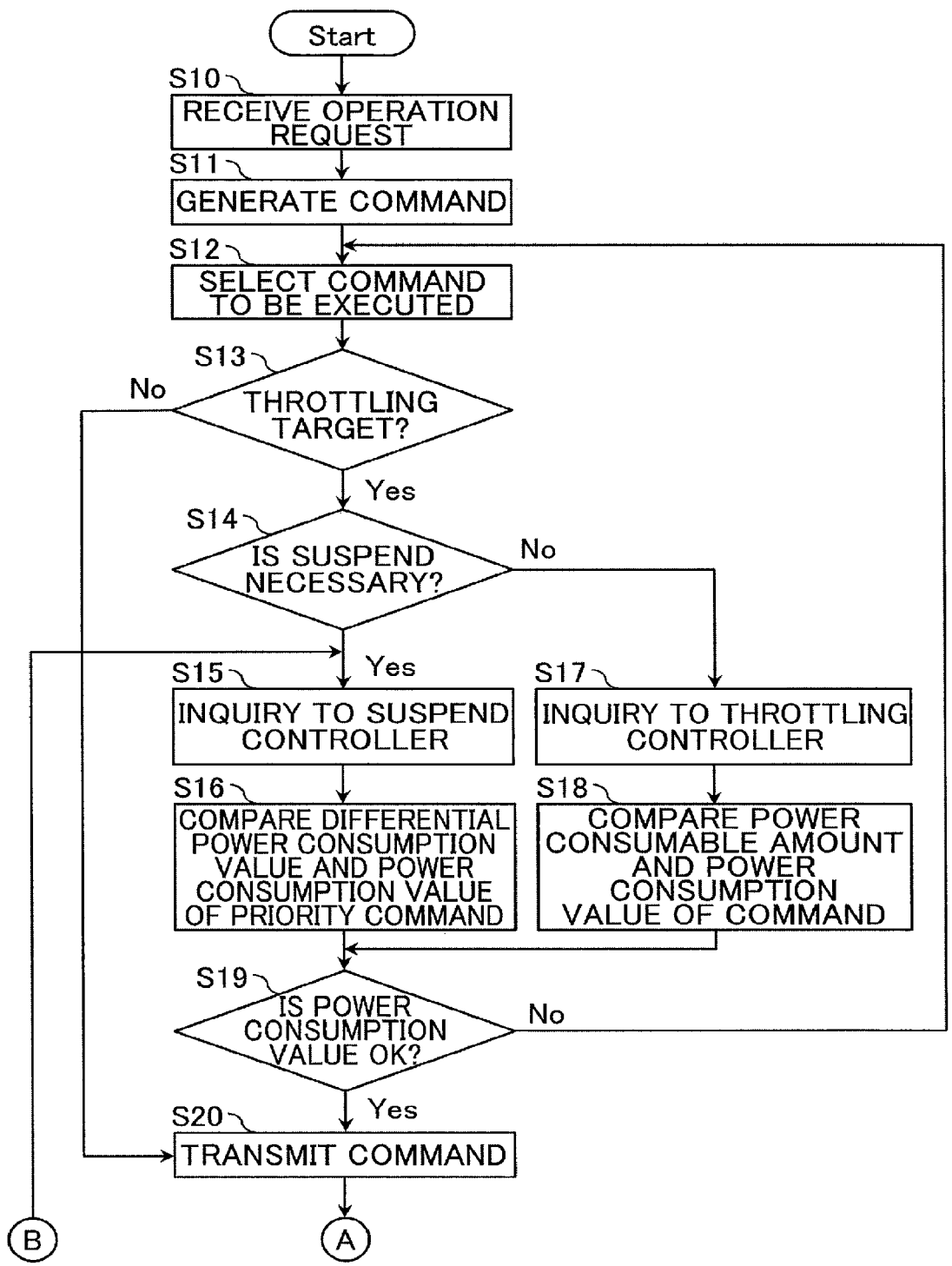
FIG. 6 is a flowchart illustrating a flow of an overall operation in the memory system according to the first embodiment.

As illustrated in FIG. 6, when the command dispatcher 22 receives an operation request (write request, read request or erase request) from the host device 2 or processor 20 (step S10), the command dispatcher 22 generates a command (step S11), and transmits the command to a selected NAND controller 25. At this time, when the command dispatcher 22 receives an operation request with high priority from the host device 2, the command dispatcher 22 transmits this command as a priority command.

Upon receiving the command, the NAND controller 25 adjusts the execution order of commands, and then selects a command to be executed (step S12).

When the selected command is not a power throttling target (step S13_No), the NAND controller 25 transmits the command to the corresponding memory chip 11 (step S20).

When the selected command is a power throttling target (step S13_Yes), the NAND controller 25 determines whether suspend is necessary, that is, whether the selected command is a priority command (step S14).

When suspend is necessary (step S14_Yes), the NAND controller 25 inquires whether the command is executable from the corresponding suspend controller 26 (step S15). More specifically, when the corresponding memory chip 11 is in an operating state and the NAND controller 25 receives a priority command from the command dispatcher 22, the NAND controller 25 transmits to the suspend controller 26 information of the command that the corresponding memory chip 11 is executing (information of power consumption, such as power consumption value) and information of the priority command, and inquires whether the priority command is executable from the suspend controller 26.

The suspend controller 26 compares the differential power consumption value, which will be generated by suspending the currently executed command, and the power consumption value of the priority command (step S16). When the differential power consumption value is larger than or equal to the power consumption value of the priority command, the suspend controller 26 determines that the priority command is executable. Then, the suspend controller 26 transmits the determination result to the NAND controller 25, and stores the differential power consumption value and the power consumption value of the priority command, for example, in the suspend controller 26. In contrast, when the differential power consumption value is smaller than the power consumption value of the priority command, the suspend controller 26 determines that the priority command is not executable. Then, the suspend controller 26 transmits the determination result to the NAND controller 25.

When suspend is not necessary (step S14_No), the NAND controller 25 inquires whether the command is executable from the throttling controller 23 (step S17). More specifically, when the corresponding memory chip 11 is not in the operating state or when the command is not a priority command, the NAND controller 25 inquires whether or not the command is executable from the throttling controller 23.

The throttling controller 23 compares the power consumable amount and the power consumption value of the command (step S18). When the power consumable amount is larger than or equal to the power consumption value of the command, the throttling controller 23 determines that the command is executable, and transmits the determination result to the NAND controller 25. When the power consumable amount is smaller than the power consumption value of the command, the throttling controller 23 determines that the command is not executable, and transmits the determination result to the NAND controller 25.

As a result of the inquiry in step S15 or step S17, when the power consumption value is determined to be OK (step S19_Yes), that is, when the suspend controller 26 or the throttling controller 23 determines that the command is executable, the NAND controller 25 transmits the command to the corresponding memory chip 11 (step S20).

More specifically, for example, when suspend is necessary, the NAND controller 25 first transmits a suspend command to the corresponding memory chip 11. Next, the NAND controller 25 transmits a command for an operation request to the corresponding memory chip 11. Note that when the corresponding memory chip 11 is already in the suspend mode, the NAND controller 25 skips the transmission of the suspend command, and transmits the command for the operation request.

In contrast, as a result of the inquiry in step S15 or step S17, when the power consumption value is not determined to be OK (step S19_No), that is, when the suspend controller 26 or the throttling controller 23 determines that the command is not executable, the NAND controller 25 returns to step S12 and selects once again a command to be executed.

As illustrated in FIG. 7, the sequencer 105 of the memory chip 11 that received a command from the NAND controller 25 executes the requested operation that is based on the command (step S21).

When suspend is necessary, to be more specific, when a suspend command is received during a write operation, the sequencer 105 suspends the write operation, and transitions in its write operation from the normal mode to the suspend mode. Next, the sequencer 105 executes the operation (for example, the read operation) that is based on the priority command. The sequencer 105 keeps the suspend mode state even after the completion of the operation based on the priority command.

In contrast, when suspend is not necessary, the sequencer 105 executes the operation based on the received command.

When the command executed in step S21 is a power throttling control target (step S22_Yes) and the memory chip 11 is in the suspend mode state (step S23_Yes), the NAND controller 25 reports to the corresponding suspend controller 26 that the operation is completed (step S24). For example, upon receiving the report of the completion from the NAND controller 25, the suspend controller 26 adds the power consumption value, which corresponds to the operation the completion of which has been reported, to the lendable power consumption amount, and updates the lendable power consumption amount. In addition, if the operation in the memory chip 11 is completed, the NAND controller 25 transmits a response for the operation request to the host device 2 or processor 20.

When the NAND controller 25 has another priority command, that is, when there is another command which is to be executed in the memory chip 11 that is in the suspend mode (step S25_Yes), the NAND controller 25 returns to step S15.

When there is no other command which is to be executed in the memory chip 11 that is in the suspend mode (step S25_No), the NAND controller 25 transmits a resume command to the memory chip 11 (step S26). Upon receiving the resume command, the sequencer 105 transitions from the suspend mode to the resume mode, and resumes the suspended operation (for example, the write operation) (step S27).

If the suspended operation is completed, the NAND controller 25 reports to the throttling controller 23 that the operation is completed (step S28). Upon receiving the report of the completion from the NAND controller 25, the throttling controller 23 adds the power consumption value, which corresponds to the operation the completion of which has been reported, to the power consumable amount, and updates the power consumable amount.

When the command executed in step S21 is not the power throttling control target (step S22_No), the NAND controller 25 transmits a response for the operation request to the host device 2 or processor 20, when the operation in the memory chip 11 is completed.

In addition, when the command executed in step S21 is the power throttling control target (step S22_Yes) and the memory chip 11 is not in the suspend mode state (step S23_No), the NAND controller 25 reports to the throttling controller 23 that the operation is completed (step S28).

For example, upon receiving a report from the NAND controller 25, the throttling controller 23 adds the power consumption value corresponding to the operation, the report of completion of which has been received, to the power consumable amount, and updates the power consumable amount. In addition, when the operation in the memory chip 11 is completed, the NAND controller 25 transmits a response for the operation request to the host device 2 or processor 20.

1.5 Effects of Present Embodiment

According to the configuration of the present embodiment, the memory system that can suppress reduction of processing capability can be provided. Such an effect will be described in detail.

In the memory system which controls the power consumption by the power throttling control, when an operation that is being executed is suspended and a priority command (a command with relatively high priority) is executed, there is a case where the power consumption value of the suspended operation is not returned to the throttling controller. Specifically, since the power consumption value from the operation start to the operation end is maintained, even if the operation is suspended, the power consumable amount does not increase. Accordingly, the number of commands, which can be concurrently executed, does not increase. Thus, in some cases, even if an operation is suspended, the power consumption value for executing a priority command is insufficient, and the priority command cannot be executed. Moreover, in some cases, if the power consumption value of the suspended operation is returned to the throttling controller, the throttling controller allocates the power consumable amount to another command, the suspended operation cannot be resumed.

In contract, according to the configuration of the present embodiment, the memory system 1 includes a plurality of suspend controllers 26 corresponding to a plurality of NAND controllers 25, respectively. In addition, in the memory system 1, for example, in the write operation and erase operation, different power consumption values can be set to the three operation modes, that is, the normal mode, suspend mode and resume mode. Thereby, the suspend controller 26 can lend the difference of the power consumption value (differential power consumption value), which is generated, for example, when the write operation transitions from the normal mode to the suspend mode in the corresponding NAND controller 25, to another command (priority command) in this NAND controller 25. Thereby, the memory system 1 can increase the number of commands which can be executed during the suspend. Accordingly, the memory system 1 can suppress reduction of the processing capability.

Alternatively, according to the configuration of the present embodiment, the memory system 1 can control the differential power consumption value with respect to each of the NAND controllers 25. Thereby, it is possible to prevent the differential power consumption value from being allocated to another NAND controller 25. Accordingly, in a memory chip 11 corresponding to one NAND controller 25, when the operation corresponding to a priority command is finished and the write operation transitions from the suspend mode to resume mode, power consumption value necessary for the resume can be secured.

2. Second Embodiment

Next, a second embodiment will be described. In the second embodiment, a description is given of an example in which the throttling controller 23 preferentially allocates a power consumption value to a specific NAND controller 25. Hereinafter, different points from the first embodiment will mainly be described. Note that in the present embodiment, the suspend controller 26 may be omitted.

2.1 Set Operation of Occupation Ratio of Power Consumption Value

A set operation of the occupation ratio of the power consumption value will be described with reference to FIG. 8.

Figure 8:
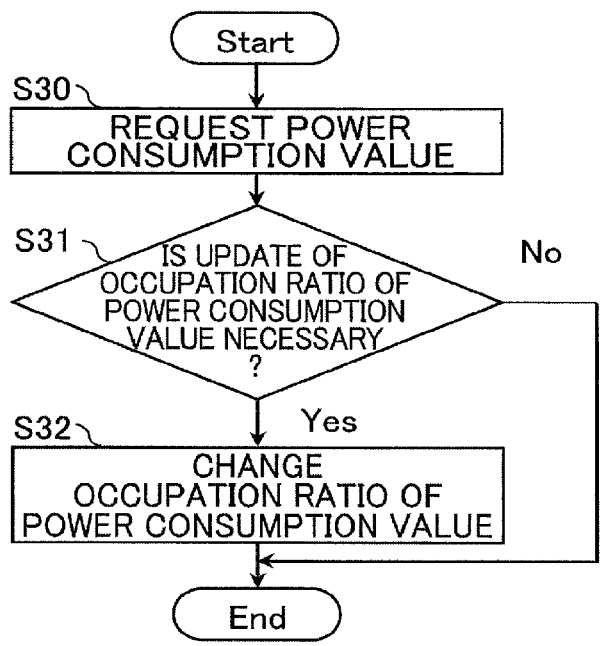
FIG. 8 is a flowchart illustrating a flow of a setup operation of an occupation ratio of a power consumption value in a memory system according to a second embodiment.

As illustrated in FIG. 8, for example, when the processor 20 causes a specific NAND controller 25 to preferentially execute an operation, the processor 20 requests the throttling controller 23 to secure a necessary power consumption value for the operation of this NAND controller 25 (step S30).

Upon receiving the request from the processor 20, the throttling controller 23 determines whether it is necessary to update the occupation ratio of the power consumption value which is set for each of the NAND controllers 25 (step S31).

When it is necessary to update the occupation ratio of the power consumption value (step S31_Yes), the power consumption value on the basis of the request of the processor 20 (step S32). More specifically, for example, in a particular memory chip 11, when garbage collection is executed, it is necessary to secure a necessary power consumption value for an erase operation of data and a move operation of valid data (a write operation to a non-erase-target block BLK). In this case, the processor 20 increases the occupation ratio of the power consumption value for the corresponding NAND controller 25, and decreases the occupation ratio of the power consumption value for the other NAND controllers 25.

When it is not necessary to update the occupation ratio of the power consumption value (step S31_No), the throttling controller 23 keeps the currently set occupation ratio of the power consumption value.

On the basis of the set occupation ratio of the power consumption value, for example, the memory system 1 executes the operation of the first embodiment as illustrated in FIG. 6 and FIG. 7.

2.2 Effects of Present Embodiment

The configuration of the present embodiment can be applied to the first embodiment.

Furthermore, according to the configuration of the present embodiment, the throttling controller 23 can change the occupation ratio of the power consumption value with respect to each of the NAND controllers 25. Thereby, when operations are concentrated on a certain memory chip 11, the power consumable amount in the corresponding NAND controller 25 can be set to a properly large value in advance. Thereby, in the throttling controller 23, it is possible to decrease the possibility that a target command is determined to be inexecutable.

3. Modification, etc.

A memory system according to embodiments includes: a first memory chip (11); and a controller (10) to which the first memory chips is coupled. The controller includes: a first circuit (22), a second circuit (25) and a third circuit (26). The first circuit is configured to issue a command. The second circuit is configured to control the first memory chip based on a command received from the first circuit. The third circuit is configured to manage a first differential power consumption value that is a difference between a first power consumption value and a second power consumption value. The first power consumption value is on first power that the first memory chip consumes while executing a first operation. The second power consumption value is on second power that the first memory chip consumes when suspending the first operation. The third circuit is configured to determine whether causing the first memory chip to suspend the first operation to execute a second operation is possible based on the first differential power consumption value.

According to the above-described embodiment, a memory system that can suppress reduction of processing capability can be provided.

Note that the embodiments are not limited to the above-described forms, and various modifications can be made.

For example, the suspend controller 26 may be included in each NAND controller 25.

Further, as illustrated in FIG. 9, one suspend controller 26 may be provided which can control the differential power consumption value in each NAND controller 25 with respect to each of the NAND controller 25.

Additionally, the processor 20 may execute firmware, thereby realizing the function of the command dispatcher 22, throttling controller 23, NAND controller 25, or suspend controller 26.

Furthermore, the memory system may be able to turn on or off the power throttling control.

Furthermore, the term "couple" or "connection" in the above-described embodiment also includes the state of indirect coupling or connecting via a transistor, a resistor, or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
    a first memory chip; and
    a controller to which the first memory chip is coupled, the controller including:
        a first circuit configured to issue a command;
        a second circuit configured to control the first memory chip based on a command received from the first circuit; and
        a third circuit configured to:
            manage a first differential power consumption value that is a difference between a first power consumption value and a second power consumption value, the first power consumption value being on first power that the first memory chip consumes while executing a first operation, the second power consumption value being on second power that the first memory chip consumes when suspending the first operation, and
            determine whether or not to cause the first memory chip to suspend the first operation to execute a second operation based on the first differential power consumption value.

2. The memory system according to claim 1, wherein the third circuit is configured to:
    compare the first differential power consumption value and a third power consumption value on third power that the first memory chip consumes when the first memory chip is caused to suspend the first operation to execute the second operation, and
    determine to cause the first memory chip to execute the second operation when the first differential power consumption value is larger than or equal to the third power consumption value.

3. The memory system according to claim 1, wherein
    the first operation includes a normal mode and a suspend mode,
    the first power consumption value corresponds to the normal mode,
    the second power consumption value corresponds to the suspend mode, and
    the first power consumption value is greater than the second power consumption value.

4. The memory system according to claim 1, further comprising a second memory chip, wherein
    the controller further includes:
        a fourth circuit configured to control the second memory chip based on a command received from the first circuit; and
        a fifth circuit configured to:
            manage a second differential power consumption value that is a difference between a fourth power consumption value and a fifth power consumption value, the fourth power consumption value being on fourth power that the second memory chip consumes while executing a third operation, the fifth power consumption value being on fifth power that the second memory chip consumes when suspending the third operation, and
            determine whether or not to cause the second memory chip to suspend the third operation to execute a fourth operation based on the second differential power consumption value.

5. The memory system according to claim 4, further comprising a sixth circuit configured to execute power throttling control of the memory system, wherein
    the sixth circuit is configured to:
        allocate a sixth power consumption value to the first memory chip to cause the first memory chip to execute the first operation while the second memory chip is executing the third operation; and
        allocate the sixth power consumption value to the first memory chip to cause the first memory chip to execute the first operation also while the second memory chip is suspending the third operation.

6. The memory system according to claim 2, wherein
    the second circuit is configured to:
    transmit a first command for causing the first memory chip to suspend the first operation; and
    transmit a second command for causing the first memory chip to execute the second operation after transmitting the first command.

7. The memory system according to claim 5, wherein
    the sixth circuit executes a function of changing a first occupation ratio of a power consumption value in the first memory chip and a second occupation ratio of a power consumption value in the second memory chip.

8. The memory system according to claim 5, wherein
    the second circuit is configured to inquire whether or not to cause the first memory chip to execute the first operation from the sixth circuit.

9. The memory system according to claim 8, wherein
    the sixth circuit is configured to determine whether or not to cause the first memory chip to execute the first operation based on a result of comparison between the first power consumption value and a power consumable amount, which are received from the second circuit.

10. The memory system according to claim 9, wherein
    the sixth circuit is further configured to add the first power consumption value to the power consumable amount when the first operation is completed in the first memory chip.

11. The memory system according to claim 2, wherein
    the third circuit is further configured to add the third power consumption value to the first differential power consumption value when the second operation is completed in the first memory chip.

12. The memory system according to claim 1, wherein
    the first operation further includes a resume mode, and
    the second circuit is configured to cause the first memory chip to resume the first operation which has been suspended when the second operation is completed.

13. The memory system according to claim 12, further comprising a sixth circuit configured to execute power throttling control of the memory system, wherein
    the sixth circuit is configured to:

allocate a seventh power consumption value to the first memory chip to cause the first memory chip to execute the first operation; and allocate the seventh power consumption value to the first memory chip to cause the first memory chip to execute the first operation also after the first memory chip resumes the first operation.

14. The memory system according to claim 12, wherein the third circuit is further configured to return the first differential power consumption value to the second circuit when the first operation is resumed.

15. The memory system according to claim 1, wherein: the second circuit is further configured to inquire whether or not to cause the first memory chip to execute the second operation from the third circuit when the second circuit receives a third command indicative of preferential execution of the second operation during a period in which the first memory chip is executing the first operation.

16. The memory system according to claim 15, wherein the second circuit is further configured to transmit, to the third circuit, information of the third command and information of a fourth command, the fourth command corresponding to the first operation.

17. The memory system according to claim 15, further comprising a sixth circuit configured to execute power throttling control of the memory system, wherein the second circuit is configured to inquire whether or not to cause the first memory chip to execute the second operation from the sixth circuit when the second circuit receives a fifth command indicative of execution of the second operation during a period in which the first memory chip is not executing the first operation.

18. The memory system according to claim 17, wherein: the sixth circuit is configured to determine whether or not to cause the first memory chip to execute the second operation based on a result of comparison between an eighth power consumption value corresponding to the fifth command and a power consumable amount, which are received from the second circuit.

19. The memory system according to claim 1, wherein the first operation is a write operation or an erase operation, and the second operation is a read operation.

* * * * *